United States Patent [19]

Zeuch et al.

[11] 4,018,566
[45] Apr. 19, 1977

[54] LIGHT RESPONSIVE MEASURING DEVICE FOR HEATER CONTROL

[75] Inventors: Klaus Zeuch, Eckental; Josef Stadter, Erlangen, both of Germany

[73] Assignee: Siemens Aktiengesellschaft, Munich, Germany

[22] Filed: Mar. 17, 1975

[21] Appl. No.: 559,016

[30] Foreign Application Priority Data

Mar. 27, 1974 Germany .......................... 2414856

[52] U.S. Cl. ............................ 23/273 SP; 156/601; 156/609; 156/610; 156/616 A; 423/111; 423/299

[51] Int. Cl.² ...................... B01J 17/08; B01J 17/06

[58] Field of Search ....... 23/273 SP, 273 A, 273 B, 23/273 SP, 273 Z, 286, 290; 156/601, 609, 610, 611, 616, 617, 613, 614; 423/111, 299; 356/44; 250/227

[56] References Cited

UNITED STATES PATENTS

| | | | |
|---|---|---|---|
| 986,180 | 3/1911 | Koenig | 23/286 |
| 2,893,847 | 7/1959 | Schweickert et al. | 23/273 SP |
| 3,188,373 | 6/1965 | Brunet et al. | 23/273 SP |
| 3,366,454 | 1/1968 | Folberth et al. | 156/616 |
| 3,877,883 | 4/1975 | Berkman | 423/111 |
| 3,884,642 | 5/1975 | Benedict | 23/273 A |

OTHER PUBLICATIONS

C. J. Frosch, et al., J. of the Electrochemical Soc., vol. 108, 1961, pp. 251–257.
F. A. Cunnell, et al., J. of Scientific Instruments, vol. 37, Nov. 1960, pp. 410–414.

*Primary Examiner*—Norman Yudkoff
*Assistant Examiner*—Barry I. Hollander
*Attorney, Agent, or Firm*—Kenyon & Kenyon Reilly Carr & Chapin

[57] ABSTRACT

In apparatus for the preparation of a semiconductor compound such as gallium phosphide using the Bridgman method in a horizontal system equipped with a heating device and disposed in a pressure vessel, the reaction tube is mounted in a stationary fashion in a reaction boat and the heating device supported so that it is moveable in the direction of the horizontal axis of the system to permit synthesis of the semiconductor compound along with zone melting and drawing of single crystals. A light guide having its free end arranged below the reaction tube is mounted to the heating device for movement therewith and is used to measure the temperature at the reaction boat.

6 Claims, 3 Drawing Figures

LIGHT RESPONSIVE MEASURING DEVICE FOR HEATER CONTROL

BACKGROUND OF THE INVENTION

This invention relates to apparatus for the preparation of a compound or an alloy having one component with a substantially higher vapor pressure than the other, preferably for the preparation of a semiconductor compound with elements selected from group IIIA and VB of the periodic table and more particularly gallium phosphide, in general and more particularly to an improved apparatus in which the reaction tube is stationary and the heating means of the system is movable.

Apparatus of the general type of the present invention is known in which the components or elements to be combined forming the compound are situated in a closed horizontal reaction tube with its end surrounded by hollow cylindrical heating ovens, one oven being provided on each end. The heating ovens are arranged in the axial direction of the tube, one behind the other at a predetermined spacing. At the portion of the tube situated between the two heating ovens, a separate heating device, generally a high-frequency heating coil, is provided. The entire system is disposed within a pressure vessel, also referred to as an autoclave, having an internal pressure which can be varied as a function of the pressure inside the tube.

As is well known, gallium phosphide has found much use recently in the manufacture of light-emitting diodes for the visible range because of its large band gap. Polycrystalline gallium phosphide, which is used as the starting material for the manufacture of suitable single crystals, is advantageously synthesized through the reaction of gallium with phosphorus in a closed system.

Typical of one manner of making polycrystalline gallium phosphide is the direct synthesis method using gallium and phosphorus at a temperature of about 1500° C and a pressure of 6 to 35 bar as disclosed by Frosch and Derick in Journal of the Electrochemical Society, Vol. 108, page 251, 1961. The components of the semiconductor compound are placed in a quartz tube which is arranged in a furnace and is provided with a high frequency heating device. The high-frequency heating device is inductively coupled to a graphite boat located in the tube and containing one of the components. For the reaction, the boat with the semiconductor component, such as gallium, is moved through the inductively heated zone of elevated temperature within the heating device. After an additional pass, dense polycrystalline gallium phosphide containing, at the end of a synthesized bar, free gallium is obtained. The induction coil for the high-frequency heating device is brought into the pressure vessel radially and is therefore not movable in the axial direction of the system. Thus to obtain a zone melting of the gallium, the tube must be moved and is supported for this purpose in a separate guide tube.

At the high temperatures which are required for the synthesis of the semiconductor compound, the strength of the wall of the tube is considerably reduced. Because of this the tube is disposed in a pressure vessel having a pressure set higher than the pressure in the tube. Since the internal pressure of the tube cannot be measured, the setting of the necessary counterpressure in the autoclave over the wide range of possible operating pressures is difficult.

It has been discovered that with a design of this nature in which the tube is movable, undesired vibrations of the melt can occur leading to disturbances of the growth. As a result the prior art equipment of this nature cannot be used for the preparation of a single-crystal material. Furthermore, the zone of elevated temperature produced by the induction heating system wide. This makes impossible a zone-melting process having a continuously traveling melting zone used for purification or the like.

In view of these difficulties, it is the object of the present invention to provide an improved apparatus which is suitable for zone purification and for single-crystal semiconductor preparation.

SUMMARY OF THE INVENTION

The present invention solves this problem by providing a stationary tube and a movable heating means. The heating oven, which is arranged concentrically with respect to the tube and is generally divided, is movable along with the induction heating device which is arranged between the two ovens or oven sections. The sensor of a temperature measuring device is also mounted so as to be movable in the axial direction of the system, i.e., in the axial direction of the tube. Thus, in accordance with the present invention the oven system and not the tube is moved. This permits an optimal, disturbance-free growth of the semi-conductor compound, particulary gallium phosphide and indium phosphide to be carried out with high internal pressures of 35 and 21 bar respectively, which becomes possible through the arrangement of the tube and the heating device in a autoclave which produces a support pressure.

Since in this system a protective melt for the semiconductor compound being produced is not required and the melt is supported completely free of vibrations, a single crystal can be produced in a subsequent drawing process.

As disclosed a light guide is preferably used for measuring temperature. A light guide e.g. an optical fiber transmits the measured temperature value to a temperature measuring device. It will read so that it measures the temperature under the boat containing the melt, the boat being inside the tube and containing one of the components, e.g. gallium. This particular arrangement of the temperature sensor is advisable since the measurement can be disturbed by precipitation if the sensor is arranged above the gallium.

In accordance with a particularly advantageous further feature of the present invention, the apparatus is equipped with a pressure-tight observation window in the wall of the autoclave. The length of this observation window is chosen such that the entire boat can be viewed. The cylindrical middle portion of the autoclave, which contains the obseration window, is supported rotatably in flanges arranged at its end so that it can be rotated about the longitudinal axis of the system. Through this rotation the obseration window is turned about the longitudinal axis of the tube so that the manufacturing process can be observed in all its details.

For controlling the monitoring the temperature of the semiconductor component which is freely supported in the ampoule, i.e. the component other than the one in the boat, a separate temperature measuring device is shown having its measuring sensor arranged in a measuring tube extending from the outer wall of the reaction tube direction into the semiconductor component, e.g. into the phosphorous.

DETAILED DESCRIPTION OF THE PREFERRED EMBODIMENT

Figure 1:
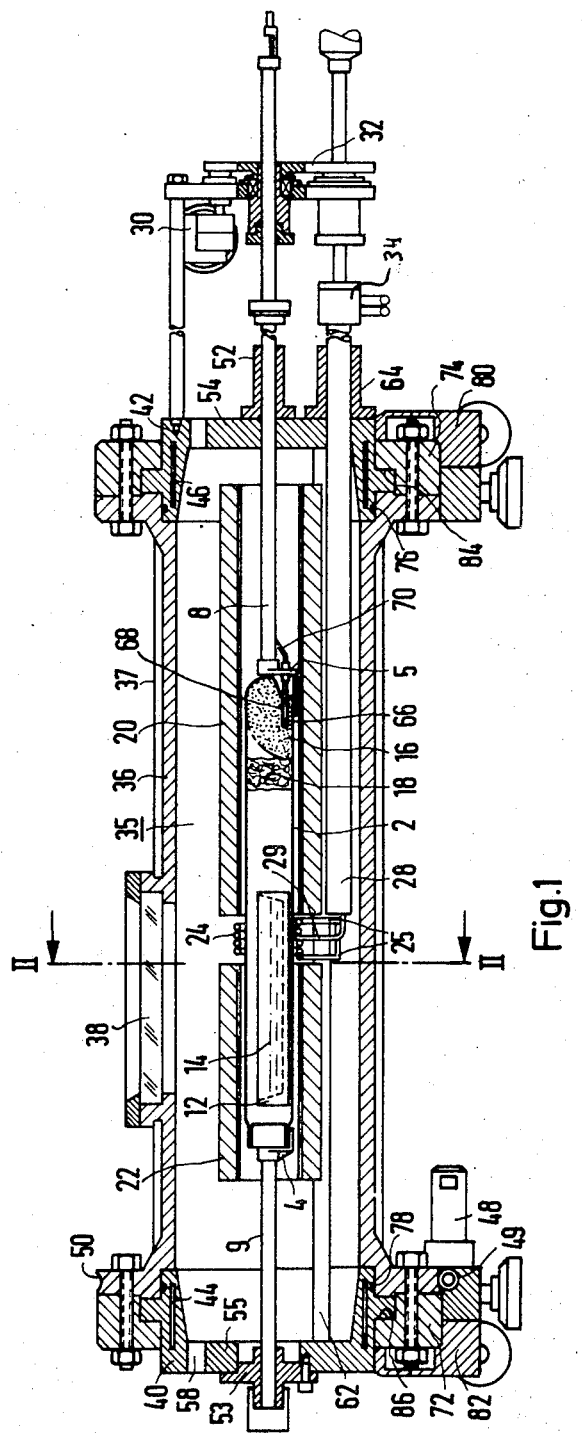
FIG. 1 is a longitudinal cross-section through the apparatus of the present invention.
Figure 3:
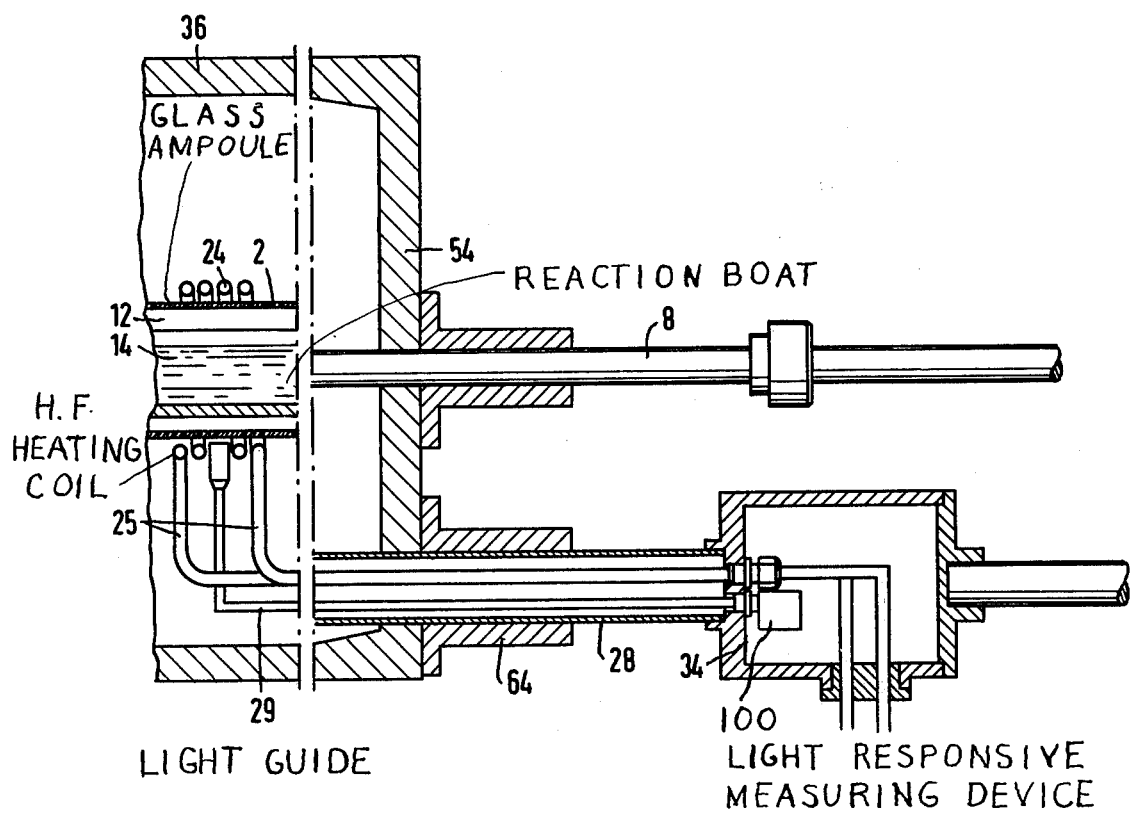
FIG. 3 is a more detailed, longitudinal cross section illustrating the light guide used in the apparatus of FIG. 1.

FIG. 1 illustrates an apparatus according to the present invention. A tube or ampoule 2 has its end resting on a spoon-shaped projections 4 and 5. The spoon-shaped projection 4 is that of a push rod 9 and the projection 5 that of a support rod 8. Within the tube 2 is a boat 12 which will preferably be made of graphite and will initially contain one of the components of the semiconductor compound to be prepared, e.g. gallium. The second component, e.g. phosphorus 16 is disposed at the right hand end of the tube 2 and separated from the reaction space by quartz wool 18. A portion of the tube containing the phosphorus is surrounded by a hollow cylindrical oven 20, which will preferably be equipped with electrical resistance heating and will herinafter be referred to as the phosphorus oven. The other oven, oven 22, is used for after heating of the semi-conductor compound and will thus be referred to as the after-heating oven. Between the two ovens 20 and 22 an indication coil or a high-frequency heating device 24 is arranged. The leads 25 of this coil 24 can be moved in the axial direction of the system by means of a pull rod 28. The pull rod 28 is driven by means of a drive motor or the like 30. The drive motor 30 is connected to the pull rod 28 and the push rod 8 through gearing 32. This permits selectively driving the rod 8 or rod 28. In the former case the ampoule 2 is moved and in the latter case the heating means. This allows the apparatus to be used in either mode of operation. Below the boat 12 the temperature sensor of the temperature measuring device is arranged. In order to transmit the measurement value a light guide 29 e.g. an optical fiber is provided which transmits the temperature measurement value to an electronic measuring device 100 for the temperature control or regulation which may be located, for example in a container 34, i.e. the inductively heated graphite boat will glow when heated with an intensity depending on the temperature. (See FIG. 3) This can then be measured to obtain a temperature measurement using a photocell or the like. The tube 2 and heating devices are disposed within an autoclave 35 having a hollow cylindrical central part 36 provided with a pressure tight observation window 38 rotatably supported in two flanges 40 and 42. The central part 36 of the autoclave will preferably be provided with separate means for cooling. In the illustrated embodiment a jacket 37 is arranged about the central part 36 for receiving a cooling medium such as water. The flanges 40 and 42 are provided with liquid cooling channels 46 and 44. This will provide cooling in application Ser. Nos. 559,015 and 559,014 filed on even date herewith and assigned to the same assignee as the present invention. The rotatable central part 36 of the autoclave 35 is rotated by a drive motor 48 through a worm gear 49 and a ring gear 50 connected to the rotatable part 36.

The push rod 8 which is brought through the wall 54 of the autoclave 35 is attached at a bracket using a pressure-tight bushing 52 and is connected with the gearing 32 of the drive motor 30. In each of the walls 54 and 55, feed-throughs for operating the ovens and guide bars for the support of the ovens are attached. Of these only the rear one 62 is visible in FIG. 1.

The second support which is needed for single crystal and zone drawing is obtained by the support rod 9 passing through the left hand wall 55. This wall contains, in addition to a feed-through for the supply of support gas, an opening which is used to put the tube 2 in place. A closure 53 of this opening is designed so that after charging the autoclave 35 the support rod with its projection 4 forms the second support point of the tube, which is exposed only in the heating device.

The pull rod 28 comprises a tube and serves as a mechanical guide for the two ovens 20 and 22 and the induction coil 24 which is water cooled. It is also used to accommodate cooling water supply lines 25 for the coil 24. At the same time the water cooling for the coil or heating 24 is used to cool the light guide 29 used for the temperature measurement of the melt 14. Thus, in the hollow pull rod 28 water-cooled cooper tubes for the supply lines 25 of the heating device 24 and the light guide 29 are accommodated. These are brought out from the pull rod through a pressure tight feed-through 64 outside the autoclave 35. The supply lines 25 for the heating device 24 will be led to a high frequency generator and its power control, which is not shown in detail on the figure, in conventional fashion. The pull rod 28 is arranged in the lower part of the autoclave 35 since this is the region of lowest temperature and the pull rod will thus be subjected to the least of thermal stress.

The bearing of the pull rod 28 i.e. the feedthrough 64, is located in the right hand wall 54 of the autoclave 35. This wall also contains the bearing for the push rod 8 in the form a pressure-tight feedthrough 52. This centrally arranged push rod 8 extends into the phosphorus oven 20 with its spoonlike extension 5 holding the tube 2 which is thus self supporting. At the same time it is used for guiding a thermocouple 66 which is arranged within a measuring tube 68 brought the wall of the tube 2 from the outside and extending into the phosphorus 16. The thermocouple 66 is attached to the spoon-like extension 5 and has leads 70 which pass within the push rod 8 and are brought out from the push rod in a pressure-tight manner through a hole. The arrangement is disclosed in more detail in application Ser. No. 561,342 and the use of the temperature outputs in Ser. No. 561,341 both filed on even date herewith and assigned to the same assignee as the present invention.

Through the use of the drive motor 30, which will preferably have an adjustable speed and direction of rotation, either the push rod 8 or the pull rod 28 is moved in the direction of the axis of the tube 2. In the later case, the two ovens 20 and 22 along with the high-frequency heating device 24 are moved over the stationarily arranged reaction tube 2°, the ovens and heating device 24 being supported on the guide bar 62 and moved by means of the pull rod 28. The pull rod 28 is connected the phosphorous oven 20 and either directly or indirectly through this oven, also to the after-heating oven 22. For zone melting, the two ovens 20 and 22 are moved relative to the semiconductor compound 14 contained in the boat 12. With this embodiment of the overall system the advantage of having a melt which is supported in a vibration-free manner during the drawing process results. As a result, single crystals can also be prepared by zone melting. By means of the light guide 29 the temperature radiation of the wall of the reaction boat is transmitted to the detector of an electronic circuit used for temperature measurement to control and regulate the heating means 24 as disclosed in the aforementioned Ser. No. 561,341.

The size and arrangement of the observation window 38 is chosen that, looking perpendicular to it, the melting zone within the high-frequency heating arrangement 24 can be observed during the entire drawing process. Thus, the length of the observation window 38 is chosen be at least as large as the length of the graphite boat 12 containing the gallium melt. Because of coating of the inner wall of the tube, the view above the gallium melt can be severely restricted. Because of this the cylindrical part 36 of the autoclave 35 is rotatably supported about its longitudinal axis in the end faces 54 and 55. Because of this arrangement, the viewing angle into the reaction boat 12 can be adjusted as desired. The rotation of the autoclave envelope during the course of the process is made possible because all devices required fpor the performance of the process and which must be moved such as the drawing rod 28, the high-frequency feed 25 and so on, are attached at the end faces 54 and 55, which are stationary during rotation. The rotatable support of the central part 36 of the autoclave is bolted to ring 72 and 74. Sealing rings 76 and 78 are inserted into grooves in the respective end faces 54 and 55 and take care of the necessary sealing of the autoclave space with respect to the outside. The end walls 54 and 55 are firmly bolted to segments 80 and 82 respectively. By means of the drive 48 and the worm gear 49, the cylindrical part 36 of the autoclave can then be rotated in the end faces 54 and 55 while being restrained longitudinally by means of the annular gaps 84 and 86 formed by the above described arrangement.

Figure 2:
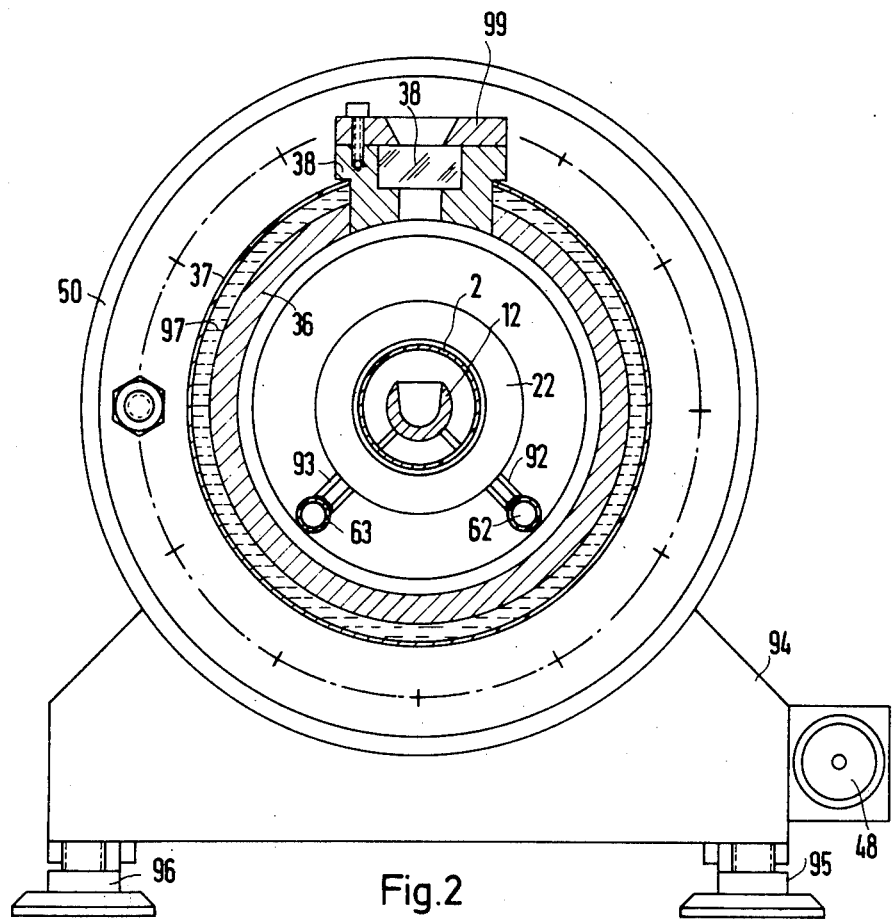
FIG. 2 is a cross-sectional view taken along the plane II—II of FIG. 1.

The manner in which the ovens 20 and 22 and the pull rod 28 for the heating device 24 along with the temperature measuring arrangement 29 are transported is illustrated on FIG. 2. The transport arrangement comprises essentially two guide bars 62 and 63. The ovens 20 and 22, of which only the after-heating oven 22 is visible in the figure, along with the heating and measuring device, are movably supported, for example through prismatic rollers 92 and 93, on the guide bars 63. The tube 2 along with the boat 12 are also shown on this figure. The jacket 37 which enclosed the central portion of the autoclave, and a coolant 97 contained therein, are also illustrated. Also shown on this figure is the manner in which the viewing window 38 is inserted in a pressure-tight manner into a holder 98 having a cover 99. It is clear from this figure how it is possible, through rotation of the central part 36 of the autoclave, to obtain a free view of all sides of the semiconductor compound being formed in the boat 12 during the synthesis. In particular, such observation is important during the subsequent drawing process.

FIG. 2 also illustrates the arrangement of the ring gear 50 for driving the central part of the autoclave as well as the attachment of the corresponding drive motor 48 to a bracket 94 which rests on the legs 95 and 96.

It is particularly advantageous if the legs 95 and 96 are adjustable in height. If such is the case it is possible to adjust, for example, for zone melting of the semiconductor compound produced using a predetermined inclination angle of the autoclave 35.

The movable support of the after-heating oven 22 on the guide bars 62 and 64 has a further advantage in that the two ovens 20 and 22 may be moved with respect to each other in the axial direction of the system. Thus, the size of the gap between the two ovens in which the heating device is arranged can be adjusted almost at will in a simple manner. This permits the temperature distribution over the heating zone to be varied and thus adapted to the operating conditions in each case.

In the embodiment shown on FIG. 1, sliding bearings 84 and 86 are shown as being used for the rotatable support of the autoclave. It will be recognized by those skilled in the art that other known kinds of support may also be used, for example, antifriction bearings such as roller bearings and, in particular, pressure roller bearings having dimensions which are relatively small even for large loads may be used.

What is claimed is:

1. In an apparatus for the preparation of a semiconductor compound, in particular gallium phosphide, said apparatus including an elongated reaction tube having a longitudinal axis containing a reaction boat, in which reaction tube the components of the compound are arranged, with said reaction tube disposed with its longitudinal axis horizontal in a horizontal system along with a heating device including an oven surrounding said tube and an inductive high frequency heater, the reaction tube and heating device arranged within an enclosed pressurized vessel, with the heating device and reaction vessel movable relative to each other, the improvement comprising:
    a. means for maintaining the reaction tube stationary;
    b. means supporting the heating device for horizontal movement with respect to the stationary tube in the direction of the longitudinal axis of said tube;
    c. means for moving said heating device; and
    d. means for measuring the temperature at said reaction boat comprising a light guide having its free end arranged near said reaction tube below the reaction boat said light guide being mounted to said heating device for movement therewith.

2. Apparatus according to claim 1 wherein said means for moving comprise a tube extending through the pressurized vessel horizontally in the lower portion thereof and mechanically coupled to said heating device.

3. Apparatus according to claim 2 wherein said means supporting comprise bars disposed in said pressurized vessel, said heating means having attached thereto prismatic rollers which rest on said guide bars.

4. Apparatus according to claim 1 wherein the pressure vessel is cylindrical and has a cylindrical center part which is provided with an observation window, said central part being mounted for rotation about the horizontal axis of the system.

5. Apparatus according to claim 1 and further including means for measuring the temperature of a component of the semiconductor compound which is freely disposed within the tube, said means comprising a thermocouple disposed within a measuring tube, said measuring tube extending from the wall of said reaction tube into the component of the semiconductor compound.

6. Apparatus according to claim 5 wherein the pressure vessel is cylindrical and has a cylindrical center part which is provided with an observation window, said central part being mounted for rotation about the horizontal axis of the system.

* * * * *